United States Patent
Wang et al.

(10) Patent No.: US 7,285,833 B2
(45) Date of Patent: Oct. 23, 2007

(54) SELECTIVE DOPING AND THERMAL ANNEALING METHOD FOR FORMING A GATE ELECTRODE PAIR WITH DIFFERENT WORK FUNCTIONS

(75) Inventors: Yen Ping Wang, Taipei (TW); Chih Hao Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 300 days.

(21) Appl. No.: 11/043,621

(22) Filed: Jan. 25, 2005

(65) Prior Publication Data
US 2006/0163661 A1   Jul. 27, 2006

(51) Int. Cl.
*H01L 29/94*   (2006.01)

(52) U.S. Cl. .............. 257/407; 257/412; 257/371; 257/E29.127; 438/199; 438/549

(58) Field of Classification Search .............. 257/412, 257/407
See application file for complete search history.

(56) References Cited

U.S. PATENT DOCUMENTS
2006/0017112 A1 * 1/2006 Wang et al. .............. 257/369
* cited by examiner

*Primary Examiner*—Jerome Jackson
*Assistant Examiner*—Paul Budd
(74) *Attorney, Agent, or Firm*—Thomas, Kayden, Horstemeyer & Risley

(57) ABSTRACT

A semiconductor product and a method for fabricating the semiconductor product provide a pair of gate electrodes formed with respect to a pair of doped wells within a semiconductor substrate. One of the gate electrodes is formed of a first gate electrode material having a first concentration of an electrically active dopant therein. A second of the gate electrodes is formed of the first gate electrode material having less than the first concentration of the electrically active dopant therein, and formed at least partially as an alloy with a second gate electrode material. The semiconductor product may be formed with enhanced efficiency.

12 Claims, 3 Drawing Sheets

SELECTIVE DOPING AND THERMAL ANNEALING METHOD FOR FORMING A GATE ELECTRODE PAIR WITH DIFFERENT WORK FUNCTIONS

FIELD OF THE INVENTION

The invention relates generally to semiconductor products. More particularly, the invention relates to gate electrodes within field effect devices within semiconductor products.

BACKGROUND OF THE INVENTION

Semiconductor products typically employ field effect transistor devices as switching elements within both logic circuits and memory circuits. Field effect transistor devices are desirable since they are readily fabricated as complementary doped pairs that provide for generally reduced power consumption within a semiconductor product.

Although prevalent within semiconductor products, the fabrication and use of complementary metal oxide semiconductor field effect transistor devices is nonetheless not entirely without problems. In particular, in order to achieve enhanced performance within complementary metal oxide semiconductor products, it is often desirable to match a work function of each gate electrode within a complementary metal oxide semiconductor product with respect to a pair of channel regions within the complementary metal oxide semiconductor product.

Although the rationale for such gate to channel performance matching is readily conceptually understood, it is nonetheless not necessarily readily achievable. Thus, the invention is directed towards efficiently forming a pair of gate electrodes within a pair of complementary metal oxide semiconductor field effect transistor devices with differing work functions.

SUMMARY OF THE INVENTION

A first object of the invention is to provide a method for forming a pair of gate electrodes within a pair of complementary metal oxide semiconductor field effect transistor devices.

A second object of the invention is to provide a method in accord with the first object of the invention, where the pair of gate electrodes is efficiently fabricated with differing work functions.

In accord with the objects of the invention, the invention provides a complementary metal oxide semiconductor product and a method for fabricating the complementary metal oxide semiconductor product.

In accord with the invention, the complementary metal oxide semiconductor product comprises a first gate electrode formed of a first gate electrode material having a first concentration of an electrically active dopant therein. The semiconductor product also comprises a second gate electrode formed at least in part of an alloy of: (1) the first gate electrode material having less than the first concentration of the electrically active dopant; and (2) a second gate electrode material.

The complementary metal oxide semiconductor product of the invention may be fabricated employing a selective doping method, in conjunction with a non-selective thermal annealing method.

The invention provides a method for efficiently fabricating a pair of gate electrodes with differing work functions within a pair of metal oxide semiconductor field effect transistor devices within a complementary metal oxide semiconductor product.

The invention realizes the foregoing object by providing within the semiconductor product: (1) a first gate electrode formed of a first gate electrode material having a first concentration of an electrically active dopant therein; and (2) a second gate electrode formed at least in part as an alloy of: (a) the first gate electrode material having less than the first concentration of the electrically active dopant; and (b) a second gate electrode material. The invention further provides a selective doping method in conjunction with a non-selective thermal annealing method for forming the complementary metal oxide semiconductor product.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for efficiently fabricating a pair of gate electrodes with differing work functions within a pair of metal oxide semiconductor field effect transistor devices within a complementary metal oxide semiconductor product.

The invention realizes the foregoing object by providing within the semiconductor product: (1) a first gate electrode formed of a first gate electrode material having a first concentration of an electrically active dopant therein; and (2) a second gate electrode formed at least in part as an alloy of: (a) the first gate electrode material having less than the first concentration of the electrically active dopant; and (b) a second gate electrode material. The invention further provides a selective doping method in conjunction with a non-selective thermal annealing method for forming the complementary metal oxide semiconductor product.

Figure 1:
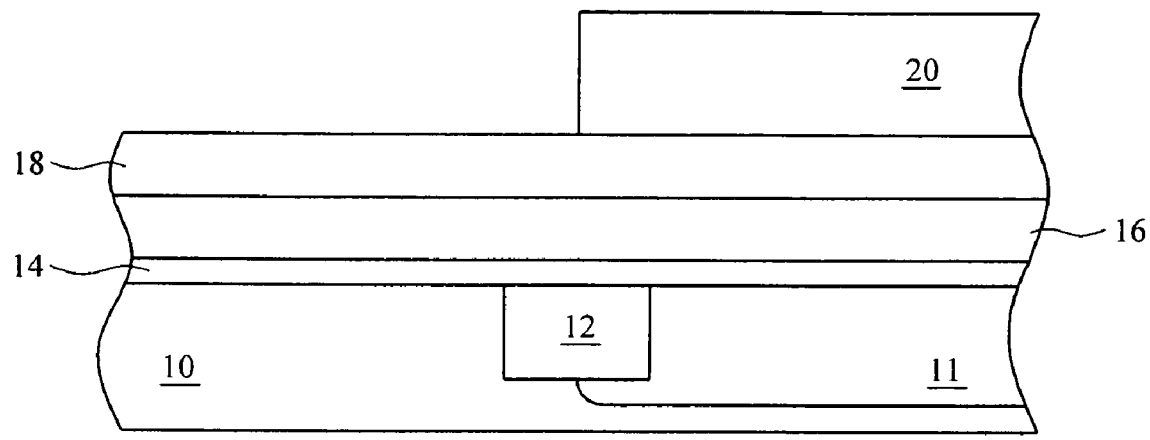
FIG. 1, FIG. 2, FIG. 3, FIG. 4 and FIG. 5 show a series of schematic cross-sectional diagrams illustrating the results of progressive stages of fabricating a complementary metal oxide semiconductor product in accord with a preferred embodiment of the invention.

FIG. 1 to FIG. 5 show a series of schematic cross-sectional diagrams illustrating the results of progressive stages in fabricating a complementary metal oxide semiconductor product in accord with a preferred embodiment of the invention. FIG. 1 shows a schematic cross-sectional diagram of the semiconductor product at an early stage in its fabrication in accord with the invention.

FIG. 1 shows a semiconductor substrate 10 having an isolation region 12 that separates a bulk region from a doped well region 11 of the semiconductor substrate 10.

The semiconductor substrate 10 may be formed of any of several semiconductor materials, and have either dopant polarity, any of several dopant concentrations and any of several crystallographic orientations. Semiconductor materials may include, but are not limited to silicon, germanium, silicon-germanium alloy and semiconductor-on-insulator semiconductor materials. Typically the semiconductor substrate 10 is a silicon semiconductor substrate.

The doped well region 11 is of polarity opposite the semiconductor substrate, and of a dopant concentration typically from about 5 to about 50 times the dopant concentration of the semiconductor substrate 10.

The isolation region 12 may be formed employing methods and materials as are conventional in the semiconductor product fabrication art. Typically, the isolation region 12 is a shallow trench isolation region formed to a depth of from about 2000 to about 6000 angstroms within the semiconductor substrate 10.

FIG. 1 also shows a blanket gate dielectric layer 14 formed upon the semiconductor substrate 10 including the isolation region 12 and the doped well region 11. A blanket first gate electrode material layer 14 is formed upon the blanket gate dielectric layer 14. A blanket second gate electrode material layer 18 is formed upon the blanket first gate electrode material layer 16. A patterned masking layer 20 is formed upon the blanket second gate electrode material layer 18. The patterned masking layer 20 covers the doped well region 11 of the semiconductor substrate 10, but not the remainder bulk region of the semiconductor substrate 10.

The blanket gate dielectric layer 14 may be formed of gate dielectric materials as are conventional in the semiconductor product fabrication art. Such gate dielectric materials may include, but are not limited to, generally lower dielectric constant dielectric materials (i.e., having a dielectric constant lower than about 10, such as silicon oxide dielectric materials, silicon nitride dielectric materials and silicon oxynitride dielectric materials) and generally higher dielectric constant dielectric materials (i.e., having a dielectric constant greater than about 10, such as hafnium oxide dielectric materials, tantalum oxide dielectric materials, barium strontium titanate dielectric materials and lead zirconate titanate dielectric materials). Typically, the blanket gate dielectric layer 14 is formed of a higher dielectric constant dielectric material formed to a thickness of from about 10 to about 70 angstroms.

The blanket first gate electrode material layer 16 is intended as being formed of a first gate electrode material whose electrical properties may be tailored incident to doping with an electrically active dopant. Such an electrically active doped first gate electrode material may be optimized with respect to the bulk region of the semiconductor substrate 10 when forming therefrom a field effect transistor device. When the semiconductor substrate 10 is formed of an N doped semiconductor material, such a first gate electrode material preferably has P type characteristics. Examples of candidate materials having P type characteristics (i.e., work functions from about 3.8 to about 4.4 volts) include but are not limited to gold, rhenium, nickel, tungsten nitride, palladium, ruthenium oxide, osmium, iridium and platinum materials. When the semiconductor substrate is formed of a P doped semiconductor material, such a first gate electrode material preferably has N type characteristics. Examples of candidate materials having N type characteristics (i.e., work functions from about 4.8 to about 5.3 volts) include, but are not limited to, titanium-tungsten alloy, chromium silicide, zirconium, tantalum nitride, niobium, aluminum, vanadium, titanium, tantalum, molybdenum, chromium and silver materials.

The electrically active dopants employed for tailoring the first gate electrode material may be selected from the group including but not limited to boron, arsenic and phosphorus dopants. Boron (as a P dopant) causes for increases in work function voltages. Phosphorus and arsenic (as N dopants) cause for decreases in work function voltages.

The blanket second gate electrode material layer 18 is formed of a second gate electrode material that at least partially interdiffuses with the first gate electrode material to form an alloy therefrom. The second gate electrode material may be selected from either of the above groups of N type and P type gate electrode materials. The first gate electrode material and the second gate electrode material are intended to provide a pair of complementary gate electrode materials with work function properties optimized with respect to the bulk region of the semiconductor substrate 10 and the doped well region 11. Typically, the blanket first gate electrode material layer 16 is formed to a thickness of from about 500 to about 1500 angstroms and the blanket second gate electrode material layer 18 is formed to a thickness of from about 1500 to about 2500 angstroms. Under such circumstances a gate electrode formed incident to rinterdiffusion of the blanket first gate electrode material layer 16 and the blanket second gate electrode material layer 18 has work function properties more closely approximate the second gate electrode material.

The patterned masking layer 20 may be formed of masking materials as are conventional in the semiconductor product fabrication art. The masking materials may include, but are not limited to photoresist masking materials and hard masking materials. Typically, the patterned masking layer 20 is formed to a thickness of from about 500 to about 10000 angstroms.

Figure 2:
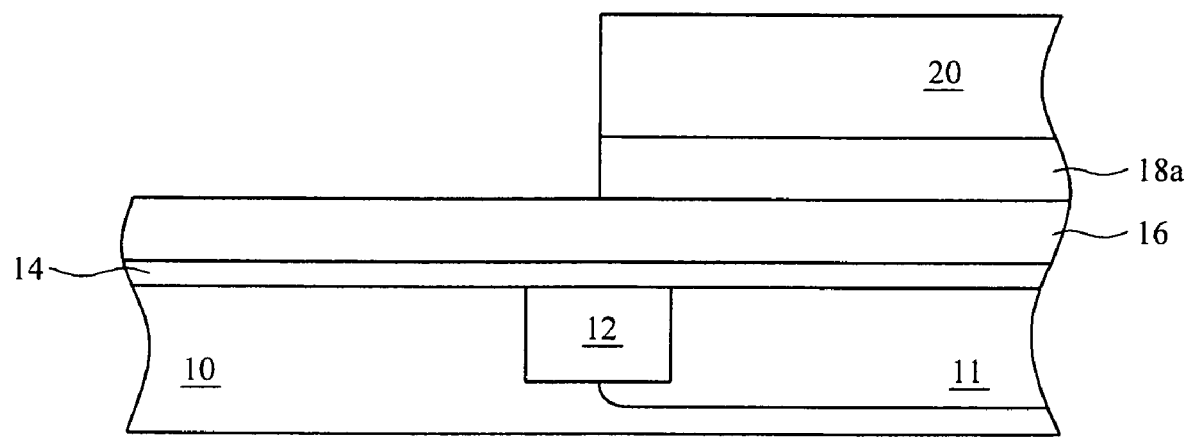

FIG. 2 shows the results of patterning the blanket second gate electrode material layer 18 to form a patterned second gate electrode material layer 18a.

The patterning may be effected employing etch methods as are conventional in the semiconductor product fabrication art. The etch methods may include, but are not limited to wet chemical etch methods and dry plasma etch methods. Typically, anisotropic plasma etch methods are preferred for forming the patterned second gate electrode material layer 18a.

Figure 3:
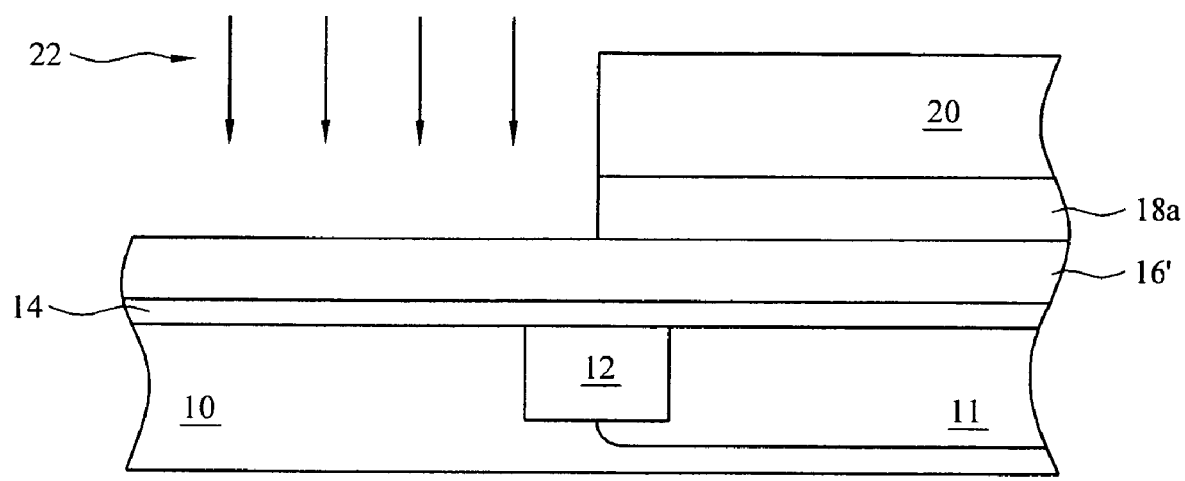

FIG. 3 shows the results of implanting a dose of electrically active dopant ions 22 into an exposed portion of the blanket first gate electrode material layer 16. The ion implantation provides a partially ion implanted blanket first gate electrode material layer 16'. In accord with disclosure above, the dose of electrically active dopant ions 22 may be selected from the group consisting of boron, phosphorus and arsenic electrically active dopant ions. Typically, the dose of electrically active dopant ions 22 is provided at a concentration of from about 1E20 to about 1E22 dopant atoms per cubic centimeter. The ion implanting with the dose of electrically active dopant ions 22 provides for a tailoring of work function of a portion of the blanket first gate electrode material layer 16. Doping incident to thermal diffusion doping methods may also be employed.

Figure 4:
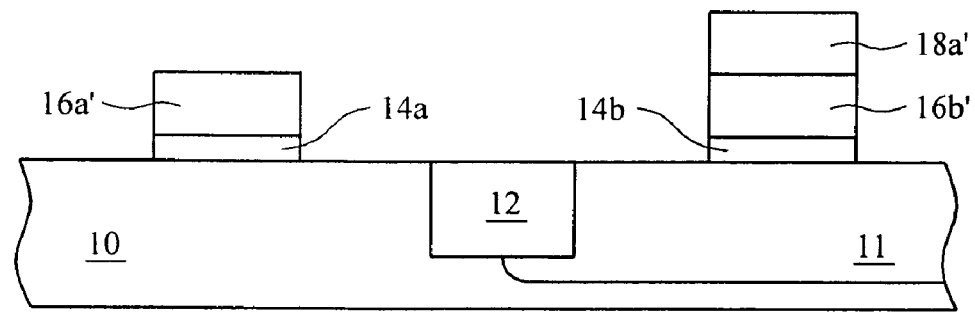

FIG. 4 first shows the results of stripping the masking layer 20 from the semiconductor product of FIG. 3. The masking layer 20 may be stripped employing methods and materials as are conventional in the semiconductor product fabrication art.

FIG. 4 also shows the results of: (1) further patterning the patterned second gate electrode material layer 18a; and (2) patterning in a first instance the partially ion implanted blanket first gate electrode material layer 16' and the blanket gate dielectric layer 14. The patterning forms a first gate electrode stack with respect to the bulk region of the semiconductor substrate 10 and a second gate electrode stack with respect to the doped well region 11 of the semiconductor substrate 10.

The first gate electrode stack includes a patterned first gate dielectric layer 14a and a patterned first gate electrode material layer 16a' aligned thereupon. The second gate electrode stack includes a patterned second gate dielectric layer 14b, a patterned first gate electrode material layer 16b'aligned thereupon and a patterned second gate electrode material layer 18a' further aligned thereupon.

The foregoing patterning may be effected employing patterning methods as are conventional in the semiconductor product fabrication art. The patterning methods will typically include anisotropic plasma etch patterning methods.

Figure 5:
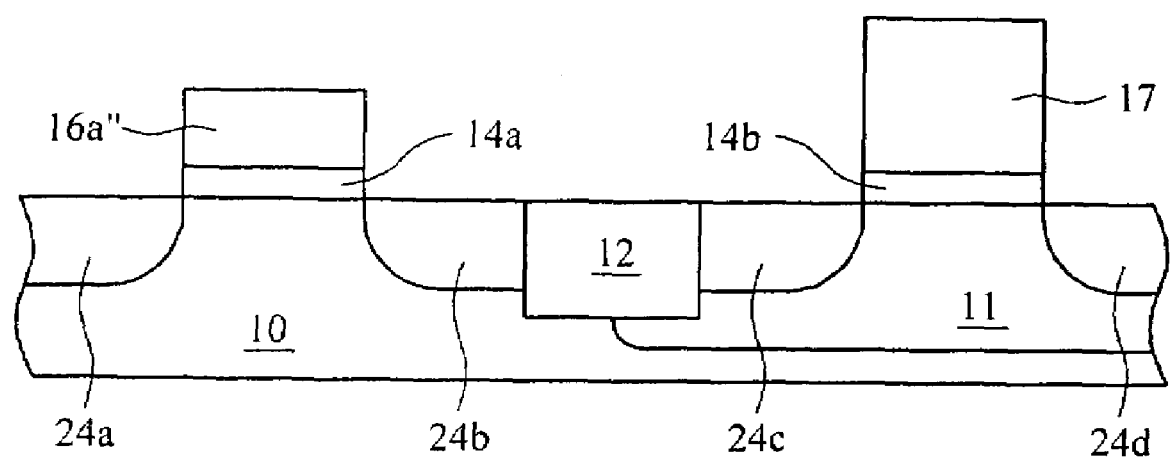

FIG. 5 shows the results of thermally annealing the semiconductor product of FIG. 4. Incident to thermal annealing, the patterned ion implanted first gate electrode material layer 16a' yields a first gate electrode 16a'' with a work function tailored with respect to the bulk region of the semiconductor substrate 10. The patterned first gate electrode material layer 16b' and the twice patterned second gate electrode material layer 18a' are thermally annealed to at least in part interdiffuse and form a second gate electrode 17 with a work function tailored with respect to the doped well region 11.

FIG. 5 also shows a series of source/drain regions 24a, 24b, 24c and 24d formed into the semiconductor substrate 10 or the doped well region 11 at areas not covered by the first gate electrode 16a'' or the second gate electrode 17. The series of source/drain regions 24a, 24b, 24c and 24d may be formed employing ion implant methods as are conventional in the semiconductor product fabrication art.

FIG. 5 shows a schematic cross-sectional diagram of a semiconductor product in accord with a preferred embodiment of the invention. The semiconductor product is a complementary metal oxide semiconductor product having a pair of field effect transistor devices. A first of the pair of field effect transistor devices has a first gate electrode formed of a first gate electrode material having a concentration of an electrically active dopant therein such that the first gate electrode is matched with a first doped region (i.e., bulk semiconductor region) when forming the first field effect transistor device. A second of the pair of field effect transistor devices has a second gate electrode formed of the first gate electrode material with a lower concentration of the electrically active dopant, at least in part alloyed with a second gate electrode material. The second gate electrode is tailored to a second doped region (i.e., doped well region) of the semiconductor substrate.

EXAMPLES

A series of P metal oxide semiconductor field effect transistor devices was fabricated employing a nickel silicide material as a gate electrode material. A first sub-group of the series of field effect transistor devices employed the nickel silicide material absent any doping. A second sub-group of the series of field effect transistor devices employed the nickel silicide material with an arsenic N type dopant. A third sub-group of the series of field effect transistor devices employed the nickel silicide material with a boron P type dopant. Work functions for each of the three sub-groups of transistors were measured. Work function results were: (1) 4.8 volts for undoped nickel silicide gate electrodes; (2) 4.5 volts for arsenic doped nickel silicide gate electrodes; and (3) 5.1 volts for boron doped nickel silicide gate electrodes. The foregoing experimental data indicates that work function values of gate electrodes may be adjusted incident to ion implantation with an appropriate electrically active dopant. This provides for efficiency and flexibility when fabricating field effect transistor devices.

The preferred embodiment of the invention is illustrative of the invention rather than limiting of the invention. Revisions and modifications may be made to methods, materials, structures and dimensions in accord with the preferred embodiment of the invention while still providing an embodiment in accord with the invention, further in accord with the accompanying claims.

What is claimed is:

1. A semiconductor product comprising:
    a semiconductor substrate having a first doped region of a first polarity and a laterally adjacent second doped region of a second polarity opposite the first polarity;
    a first gate electrode having a first work function where the first gate electrode is over first doped region, the first gate electrode being formed of a first gate electrode material having a first concentration of an electrically active dopant incorporated therein, wherein the first gate electrode has a first thickness; and
    a second gate electrode having a second work function where the second gate electrode is over the second doped region, the second gate electrode being formed of the first gate electrode material having less than the first concentration of the electrically active dopant incorporated therein, and at least partially formed as an alloy with a second gate electrode material, wherein the second gate electrode has a second thickness lamer than the first thickness.

2. The semiconductor product of claim 1 wherein the semiconductor substrate is selected from the group consisting of silicon, germanium, silicon-germanium alloy and semiconductor-on-insulator semiconductor substrates.

3. The semiconductor product of claim 1 wherein the first polarity is a P polarity and the second polarity is an N polarity.

4. The semiconductor product of claim 1 wherein the first polarity is an N polarity and the second polarity is a P polarity.

5. The semiconductor product of claim 1 wherein the first gate electrode is employed in a P field effect device.

6. The semiconductor product of claim 1 wherein the first gate electrode is employed within an N field effect device.

7. The semiconductor product of claim 1 further comprising: a first gate dielectric layer interposed between the first gate electrode and the first doped region; a second gate dielectric layer interposed between the second gate electrode and the second doped region.

8. The semiconductor product of claim 1 further comprising:
    a first pair of source/drain regions formed into the first doped region and separated by the first gate electrode; and
    a second pair of source/drain regions formed into the second doped region and separated by the second gate electrode.

9. A semiconductor product comprising:
    a semiconductor substrate having a first doped region of a first polarity and a laterally adjacent second doped region of a second polarity opposite the first polarity;
    a first gate electrode having a first work function where the first gate electrode is over the first doped region, the first gate electrode being formed of a first gate electrode material having a first concentration of an electrically active dopant incorporated therein, wherein the first gate electrode has a first thickness;

a second gate electrode having a second work function where the second gate electrode is over the second doped region, the second gate electrode being formed of the first gate electrode material having less than the first concentration of the electrically active dopant incorporated therein, and at least partially formed as a metal alloy with a second gate electrode material, wherein the second gate electrode has a second thickness larger than the first thickness;

a first gate dielectric layer interposed between the first gate electrode and the first doped region;

a second gate dielectric layer interposed between the second gate electrode and the second doped region;

a first pair of source/drain regions formed into the first doped region and separated by the first gate electrode; and a second pair of source/drain regions formed into the second doped region and separated by the second gate electrode.

10. The semiconductor product of claim 9 wherein the semiconductor substrate is selected from the group consisting of silicon, germanium, silicon-germanium alloy and semiconductor-on-insulator semiconductor substrates.

11. The semiconductor product of claim 9 wherein the first polarity is a P polarity and the second polarity is an N polarity.

12. The semiconductor product of claim 9 wherein the first polarity is an N polarity and the second polarity is a P polarity.

* * * * *